United States Patent
Shizuya et al.

(10) Patent No.: US 9,007,038 B2
(45) Date of Patent: Apr. 14, 2015

(54) DIRECT-CURRENT STABILIZED POWER SUPPLY DEVICE

(75) Inventors: Osamu Shizuya, Osaka (JP); Yukitaka Miyata, Osaka (JP); Yasufumi Konishi, Osaka (JP)

(73) Assignee: Onamba Co., Ltd. (JP)

( * ) Notice: Subject to any disclaimer, the term of this patent is extended or adjusted under 35 U.S.C. 154(b) by 0 days.

(21) Appl. No.: 13/133,623

(22) PCT Filed: Jun. 14, 2010

(86) PCT No.: PCT/JP2010/003925
§ 371 (c)(1),
(2), (4) Date: Jun. 8, 2011

(87) PCT Pub. No.: WO2011/158278
PCT Pub. Date: Dec. 22, 2011

(65) Prior Publication Data
US 2013/0099760 A1    Apr. 25, 2013

(51) Int. Cl.
*G05F 1/00* (2006.01)
*G05F 1/613* (2006.01)
(Continued)

(52) U.S. Cl.
CPC .......... *G05F 1/468* (2013.01); *H01L 31/02021* (2013.01); *H02J 3/383* (2013.01); *H02M 3/156* (2013.01); *H02M 2001/0045* (2013.01); *Y02E 10/563* (2013.01)

(58) Field of Classification Search
CPC .......... G05F 1/46; G05F 1/468; G05F 1/461; G05F 1/465; G05F 1/67; G05F 1/565; G05F 1/56; G05F 1/562; G05F 1/563; G05F 3/08; G05F 3/16; G05F 3/18; G05F 3/185; G05F 3/20; H02M 3/156; H02M 3/155; H02M 2001/0045; H01L 31/02021; H02J 3/38; H02J 3/383; H02J 3/385

USPC ........ 323/266, 280, 312, 351, 906, 311, 908, 323/901, 222–226, 268–276, 282–288, 323/299–303; 363/21.01, 62, 49, 55, 363/44–48, 50–54, 123–130; 361/18, 361/88–92, 93.9
See application file for complete search history.

(56) References Cited

U.S. PATENT DOCUMENTS 7,400,060 B2 * 7/2008 Ueno ........................... 307/10.1
2003/0206421 A1 * 11/2003 Suh et al. .................... 363/21.01
(Continued)

FOREIGN PATENT DOCUMENTS

JP    62095936    5/1987
JP    04-208035   7/1992
(Continued)

OTHER PUBLICATIONS

Yukari Nakamura, "International Preliminary Report on Patentability" in connection with related PCT Application Serial No. PCT/JP2010/003925, dated Jan. 15, 2013, 5 pages.

*Primary Examiner* — Timothy J Dole
*Assistant Examiner* — Carlos Rivera-Perez
(74) *Attorney, Agent, or Firm* — Kolisch Hartwell, P.C.

(57) ABSTRACT

A direct-current stabilized power supply device for stepping down an input voltage from a solar cell, including: a first constant voltage power supply circuit connected to the solar cell and including a constant current limiter circuit; a switch circuit; a switching-type second constant voltage power supply circuit connected to the switch circuit; and a voltage detection circuit that detects the output voltage of the first constant voltage power supply circuit. When the detected output of the first power supply circuit is equal to or higher than a first determination voltage, the switch circuit is closed, and power is supplied to the load from the second power supply circuit, and when the detected voltage is equal to or lower than a second, lower, determination voltage the switch circuit is opened, and the power supplied from the second power supply circuit is stopped.

7 Claims, 9 Drawing Sheets

(51) Int. Cl.
   *G05F 3/16* (2006.01)
   *G05F 1/46* (2006.01)
   *H01L 31/02* (2006.01)
   *H02M 3/156* (2006.01)
   *H02J 3/38* (2006.01)
   *H02M 1/00* (2006.01)

(56) References Cited

U.S. PATENT DOCUMENTS

2007/0279018 A1* 12/2007 Sumitomo et al. ............ 323/224
2008/0246454 A1* 10/2008 Nakata et al. ................. 323/282
2010/0201200 A1* 8/2010 Hori ................................ 307/82
2010/0214808 A1* 8/2010 Rodriguez ...................... 363/37
2011/0031955 A1* 2/2011 Cheng et al. .................. 323/312

FOREIGN PATENT DOCUMENTS

| JP | 06-245492 | | 9/1994 |
| JP | 2000-023369 | | 1/2000 |
| JP | 2000184697 | * | 6/2000 |
| JP | 2003-209968 | | 7/2003 |
| JP | 2006-280177 | | 10/2006 |

* cited by examiner

DIRECT-CURRENT STABILIZED POWER SUPPLY DEVICE

TECHNICAL FIELD OF THE INVENTION

The present invention relates to a direct-current stabilized power supply device that drops a voltage from a power supply of a solar cell in which output power is unstable, and supplies a stable voltage necessary for measurement equipment and the like.

BACKGROUND ART

In recent years, in order to deal with the global warming problem, a power generation system by a solar cell has become rapidly widespread. Also, efficiency of the power generation system has been enhanced, and operation equipment thereof has been improved to be stabilized. Therefore, in the case where a scale of power generation equipment is large, measurement equipment to be associated therewith becomes necessary, and performance to save power and allow a stable operation is required also for supply of a power supply to the measurement equipment.

Heretofore, in the case where a power supply voltage on a supply side that operates the measurement equipment and a voltage of the power supply necessary for the measurement equipment and the like are different from each other, a value of the power supply voltage has been stepped down by using a serial-type constant voltage circuit or a constant voltage circuit including a switching element having good power conversion efficiency.

Figure 8:
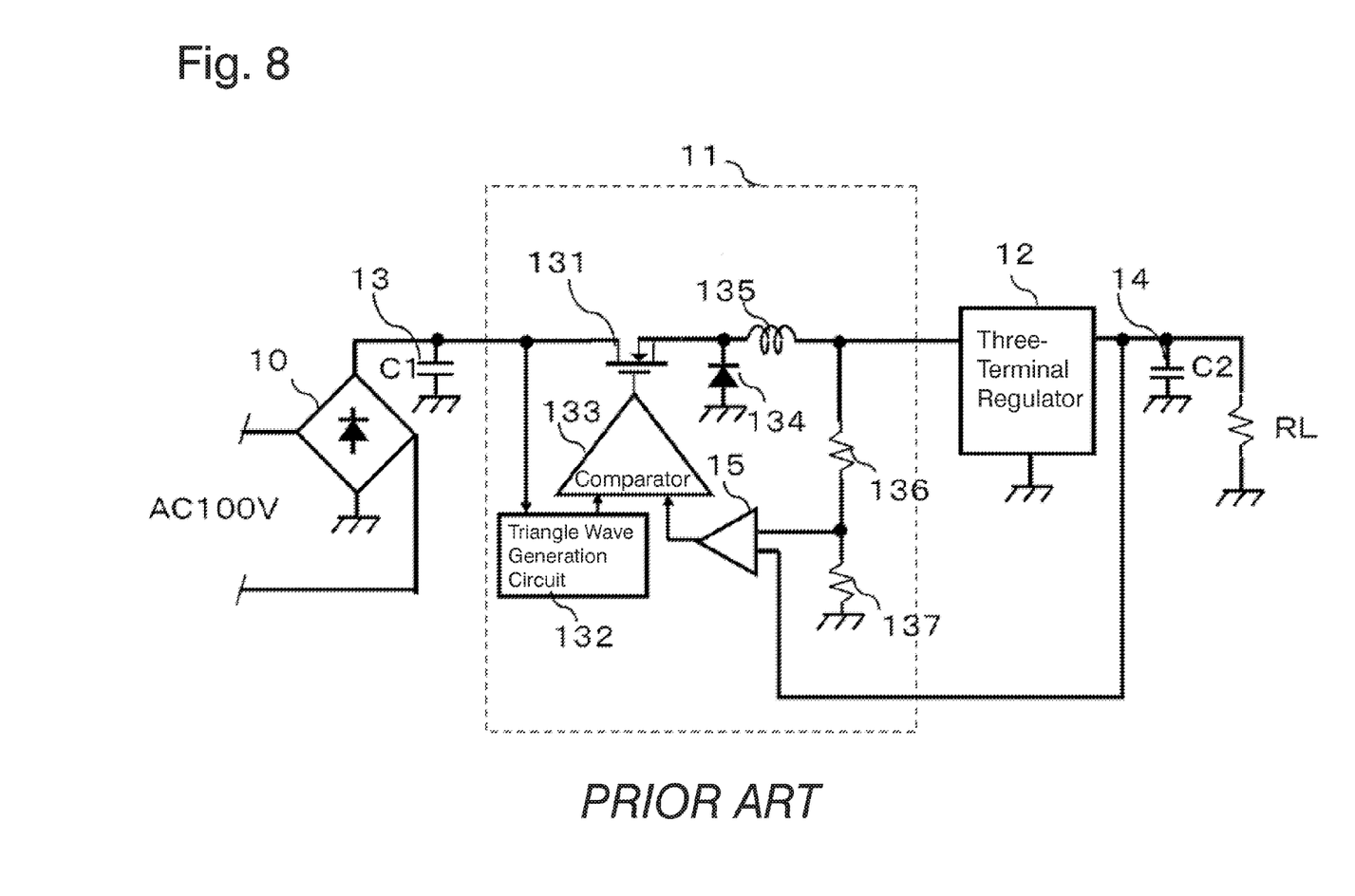
FIG. 8 is a schematic view of a conventional direct-current stabilized power supply device.

For example, in Patent Document 1, a direct-current stabilized power supply device is disclosed, in which a serial-type constant voltage circuit and a stabilizing circuit including a switching element are combined with each other. FIG. 8 is a schematic diagram of the direct-current stabilized power supply device described in Patent Document 1.

In FIG. 8, a rectifier circuit 10 rectifies AC 100V, and supplies a switching power supply circuit 11 with a current as an input voltage thereto. The switching power supply circuit 11 compares, by a comparator 133, a triangular wave, which is generated by a triangular wave generation circuit 132, with an output voltage of an inductor 135 and an output voltage of a three-terminal regulator 12. In such a way, the switching power supply circuit 11 creates a necessary switching control signal, and drives a switching element 131. Specifically, the voltage that is dropped once in the switching power supply circuit 11 is further converted by the three-terminal regulator 12 into a low voltage, which is necessary for a power supply load RL, and a current is then supplied thereto.

However, in such a conventional configuration viewed in Patent Document 1, in the case where a voltage of photovoltaic power generation exceeds 500V, there is no margin in high withstand voltage performance required for the switching element, and further, large power is necessary for a control circuit for the switching element at the time of such a high voltage, leading to complexity of the circuit and requirement for performance of circuit elements, and accordingly, it is difficult to realize this configuration.

Moreover, in Patent Document 2, it is disclosed that, in an unstable state such as cloudy weather, a power supply device using a solar cell output is combined with a battery. However, in this configuration, the battery in which a lifetime is restricted in terms of the number of charge/discharge times cannot be used for a measurement device for use in a photovoltaic power generation device for which a long lifetime is expected.

Furthermore, in Patent Document 3, it is disclosed that, in the case where the power supplied from the solar cell to the power supply falls short, a power is supplied from a commercial power supply in parallel thereto. However, in this configuration, the commercial power supply is used, and accordingly, in particular in large-scale photovoltaic power generation equipment, it costs enormously to wire a power supply line, and extra power is consumed.

Moreover, in Patent Document 4, a power supply device is disclosed, which supplies power of a high voltage through a switching element to a low-voltage load. However, in this configuration, a similar problem to that in Patent Document 1 is still present.

PRIOR ART DOCUMENTS

Patent Documents

Patent Document 1: Japanese Patent Application Laid-Open (JP-A) No. 245492/94
Patent Document 2: Japanese Patent Application Laid-Open (JP-A) No. 2000-23369
Patent Document 3: Japanese Patent Application Laid-Open (JP-A) No. 2006-280177
Patent Document 4: Japanese Patent Application Laid-Open (JP-A) No. 2003-209968

DISCLOSURE OF THE INVENTION

Problem that the Invention is to Solve

In the photovoltaic power generation, the voltage rises from 0V at an early morning time, and also during a daytime, power generation conditions differ depending on the weather such as not only a clear weather but also a cloudy weather and a rainy weather, and further, a clear and sunny weather. Moreover, power generation efficiency differs depending on the time of day owing to a difference between the direction of the sunlight and a direction of a panel as a solar cell module, and accordingly, a power generation voltage varies heavily and largely depending on the quantity of the solar radiation. When fluctuation of the voltage to be inputted to the serial-type constant voltage circuit is large as described above, a difference between the input voltage and an output voltage also fluctuates largely, and a power loss also fluctuates largely. Therefore, for the photovoltaic power generation, components prepared while assuming the worst-case condition of the power loss have had to be selected, and a large heat radiation plate has had to be employed for a control FET.

Figure 9:
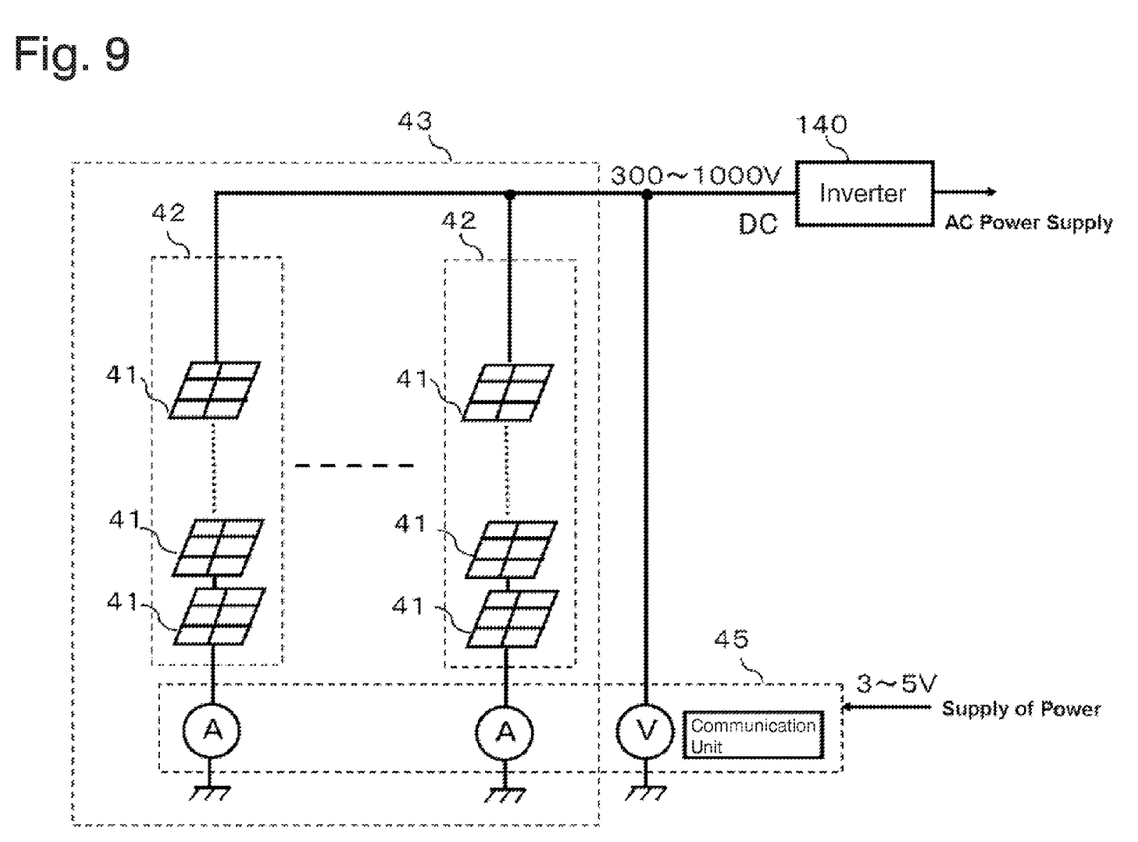
FIG. 9 is a schematic view of a configuration example of a solar cell power supply.

In the large-scale power generation by the solar cell, as shown in FIG. 9, a plurality of solar cell modules 41 are connected in series to one another, whereby each string 42 is formed. Moreover, a plurality of the strings 42 are connected in parallel to one another, whereby a solar cell power supply 43 is formed. The solar cell power supply 43 is allowed to supply power through an inverter 140 that converts the power into a commercial alternating-current power supply. In such a power generation system as described above, measurement equipment 45 is installed, which monitors a voltage, a current and the like in power generation circumstances. A power is supplied to the measurement equipment 45 from the outside. For a power supply thereof, extra wires are unnecessary if power can be supplied thereto from the solar cell. However, a voltage to be generated in the strings 42 by a plurality of solar cell modules 41 is designed at 300V to 1000V, and accordingly, there have bee such difficulties as below in order to step down the voltage to an approximate range of 3V to 5V, which is necessary for the measurement equipment 45.

(i) In the serial-type constant voltage circuit, the power loss is large, and it is necessary to take measures against heat generation of the circuit, and in the case where a current value therein is large, a large heat radiation device is necessary.

(ii) It is necessary to use power generated in a solar cell panel while minimizing the power concerned.

(iii) At around dawn and sunset, the voltage generated by the solar cell is small and unstable, and cannot be used.

(iv) In order to step down the voltage of 300V to 1000V by a switching-type stabilized power supply, withstand voltage performance of 1000V or more is necessary for components including the switching element and peripheral circuits. Components having the withstand voltage performance as described above are expensive.

The present invention has been made in order to solve the above-mentioned problems inherent in the conventional technology. It is an object of the present invention to provide a simple direct-current stabilized power supply device inexpensively, which can drop the voltage from the power supply of the solar cell in which the output voltage fluctuates, and can supply the stable voltage to the measurement equipment and the like.

Means for Solving the Problem

In order to achieve the foregoing object, the present invention has configurations of the following (1) to (7).

(1) A direct-current stabilized power supply device that steps down a direct-current input voltage obtained from a solar cell and outputs the stepped-down voltage to a load such as measurement equipment, the device including: a first constant voltage power supply circuit that is of a serial type and steps down the voltage, the first constant voltage power supply circuit being connected to the solar cell and including a constant current limiter circuit; a switch circuit connected to the first constant voltage power supply circuit; a switching-type second constant voltage power supply circuit connected to the switch circuit; and a voltage detection circuit that detects an output voltage of the first constant voltage power supply circuit, wherein, in a case where the output voltage of the first constant voltage power supply circuit is detected, and the detected voltage is equal to or higher than a first determination voltage, then the switch circuit is turned to a closed state, and power is supplied to the load from the second constant voltage power supply circuit, and in a case where the detected voltage is equal to or lower than a second determination voltage lower than the first determination voltage, then the switch circuit is turned to an opened state, and the power supplied to the load from the second constant voltage power supply circuit is stopped.

(2) The direct-current stabilized power supply device according to (1), wherein the first determination voltage is equal to or lower than 4/5 of a rating voltage at which the output voltage of the first constant voltage power supply circuit is stabilized, and the second determination voltage is equal to or higher than 6/5 of a minimum input voltage at which an output voltage of the second constant voltage power supply circuit is stabilized.

(3) A direct-current stabilized power supply device that steps down direct-current input power obtained from a solar cell and outputs the stepped-down power to a load such as measurement equipment, the device including: a first constant voltage power supply circuit that is of a serial type and steps down a voltage, the first constant voltage power supply circuit being connected to the solar cell and including a constant current limiter circuit; a switch circuit connected to the first constant voltage power supply circuit; a switching-type second constant voltage power supply circuit connected to the switch circuit; and a voltage detection circuit that detects a power generation voltage of the solar cell, wherein the switch circuit is operated such that in a case where the power generation voltage of the solar cell is detected, and the detected voltage is equal to or higher than a first determination voltage, then power is supplied to the load from the second constant voltage power supply circuit, and in a case where the detected voltage is equal to or lower than a second determination voltage lower than the first determination voltage, then the power supplied to the load from the second constant voltage power supply circuit is stopped.

(4) The direct-current stabilized power supply device according to (3), wherein the first determination voltage ranges from 2/3 to 4/5 of a rating voltage as a voltage value at which the solar cell stably generates power, and the second determination voltage is equal to or lower than 1/3 of the rating voltage.

(5) The direct-current stabilized power supply device according to any one of (1) to (4), wherein a maximum supply current value limited by the first constant voltage power supply circuit is 1 to 1.5 times a maximum supply current value limited by the second constant voltage power supply circuit.

(6) The direct-current stabilized power supply device according to any one of (1) to (5), wherein the first constant voltage power supply circuit includes a constant current limiter circuit formed of a Zener diode and an N-MOS type FET.

(7) The direct-current stabilized power supply device according to any one of (1) to (6), wherein the first constant voltage power supply circuit includes a first constant current limiter circuit and a second constant current limiter circuit that has a function to perform feedback control for the output voltage of the first constant voltage power supply circuit, in which a high voltage to be applied between an input terminal and output terminal of the first constant voltage power supply circuit is equally divided.

Advantages of the Invention

In accordance with the direct-current stabilized power supply device of the present invention, the input voltage from the solar cell in which the power generation voltage varies heavily can be stably supplied to the power supply necessary for the load such as the measurement equipment. Moreover, the switching power supply is operated, whereby the efficiency of the voltage conversion is high in the whole of the power supply device.

BEST MODE FOR CARRYING OUT THE INVENTION

A description is made below of embodiments of a direct-current stabilized power supply device of the present invention while referring to the drawings.

First Embodiment

Figure 1:
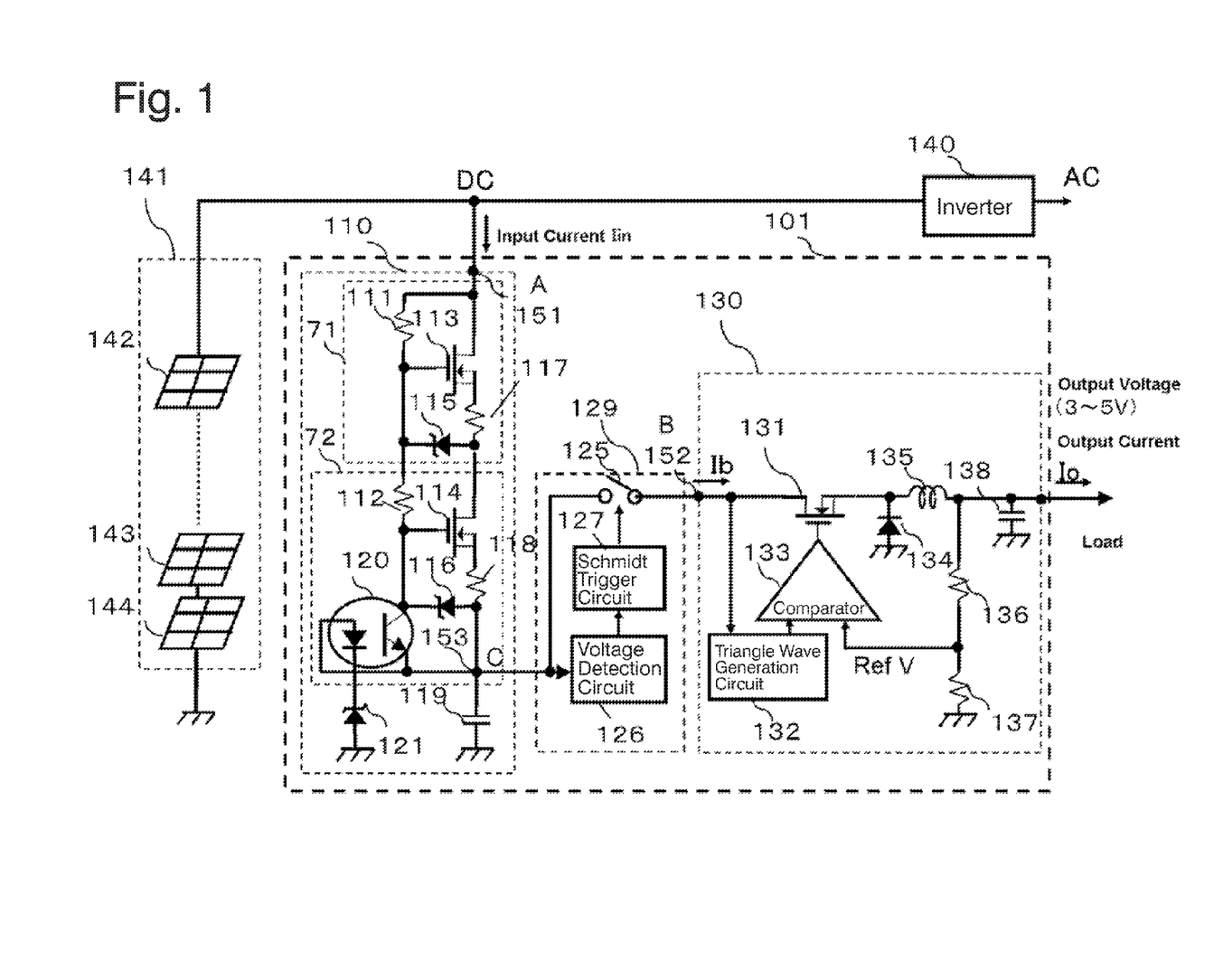
FIG. 1 is a configuration diagram of a first embodiment of a direct-current stabilized power supply device of the present invention.

FIG. 1 is a configuration diagram of a first embodiment of the direct-current stabilized power supply device of the present invention. In FIG. 1, a solar cell 141, in which photovoltaic power generation modules 142, 143 and 144 are connected in series to one another, outputs direct-current power in response to intensity of light radiated from the sun, and in usual, supplies the direct-current power to an input of an inverter 140 that converts the direct-current power into a commercial alternating current power for use in households and the like. A direct-current stabilized power supply device 101 includes: a first constant voltage power supply circuit 110 that is in charge of constant current control, is of a serial type, and drops a voltage; a switch circuit 129 having a voltage detection circuit 126, and having a Schmidt trigger circuit 127 that turns to a closed state at a voltage value V1 or higher and turns to an opened state at a voltage value V2 or lower; and a switching-type second constant voltage power supply circuit 130 including a switching element 131.

The first constant voltage power supply circuit 110 in charge of the constant voltage control configures a first current limiter circuit 71 by an N-MOS type FET 113, a Zener diode 115 and a current limiter resistor 117, and configures a second current limiter circuit 72 by an N-MOS type FET 114, a Zener diode 116 and a current limiter resistor 118. The first constant voltage power supply circuit 110 prevents a fixed quantity of a current or more from flowing through an input terminal of the direct-current stabilized power supply device 101 by the first current limiter circuit 71 and the second current limiter circuit 72. Moreover, at the time when a voltage between both ends of a capacitor 119 reaches a Zener voltage of a Zener diode 121, which determines an output voltage of the constant voltage power supply circuit 110, by a phototransistor 120 and the Zener diode 121, a supply current of the second current limiter circuit 72 is turned off. In such a way, a necessary constant voltage is obtained.

Figure 2:
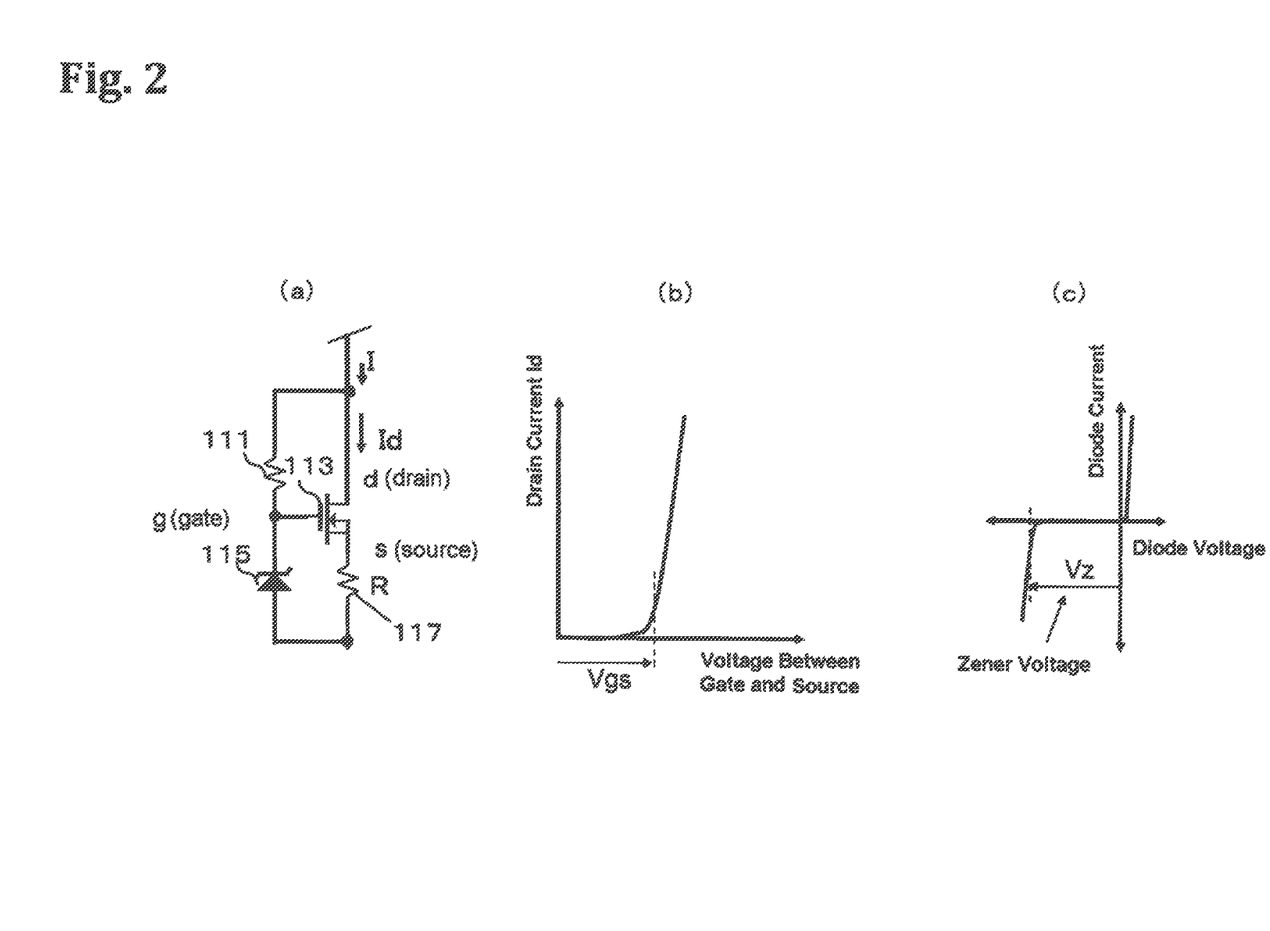
FIGS. 2(a) to 2(c) are explanatory views of a constant current limiter circuit.

Here, a description is made of a principle of a constant current control circuit by using FIGS. 2(*a*) to 2(*c*). FIG. 2(*a*) shows a basic circuit configuration for obtaining constant current characteristics, FIG. 2(*b*) is a characteristic chart of a voltage Vgs between a gate and source of the N-MOS type FET and a drain current Id thereof, and FIG. 2(*c*) is a current characteristic chart of the Zener diode.

As a value of a bias resistor 111, a resistance value is selected, which is large enough to apply a bias to the gate of the N-MOS type FET 113 and to apply a Zener voltage to the Zener diode 115. Accordingly, a circuit current I in FIG. 2(*a*) is substantially equal to the drain current Id of the N-MOS type FET 113. A voltage to be applied to the resistor 117 connected to the source terminal of the N-MOS type FET 113 is a difference between a Zener diode voltage Vz and the voltage Vgs between the gate and the source, and the flowing drain current Id becomes (Vz-Vgs)/R at the time when a resistance value of the current limiter resistor 117 is R. Specifically, the drain current Id is limited by a current value determined by the resistance value R.

The switch circuit 129 detects, by the voltage detection circuit 126, the voltage of the capacitor 119 in an output unit of the first constant voltage power supply circuit 110. The switch circuit 129 drives a switch 125 by the Schmidt trigger circuit 127. The Schmidt trigger circuit 127 shifts the switch 125 to a switch closing operation and maintains a closed state thereof at the time when the detected voltage reaches the voltage value V1 at which a current necessary to activate the switching-type second constant voltage power supply circuit 130 can be supplied; and shifts the switch 125 to a switch opening operation at the voltage value V2 or lower of the input voltage of the second constant voltage power supply circuit 130, from which the output voltage of the second constant voltage power supply circuit 130 starts to drop. Preferably, the voltage value V1 is equal to or lower than 4/5 of a rating voltage at which an output voltage of the first constant voltage power supply circuit 110 is stabilized, and the voltage value V2 is equal to or higher than 6/5 of a minimum input voltage at which an output voltage of the second constant voltage power supply circuit 130 is stabilized. In such a way, it can be expected that the direct-current stabilized power supply device 101 stably operates with high reliability.

Figure 3:
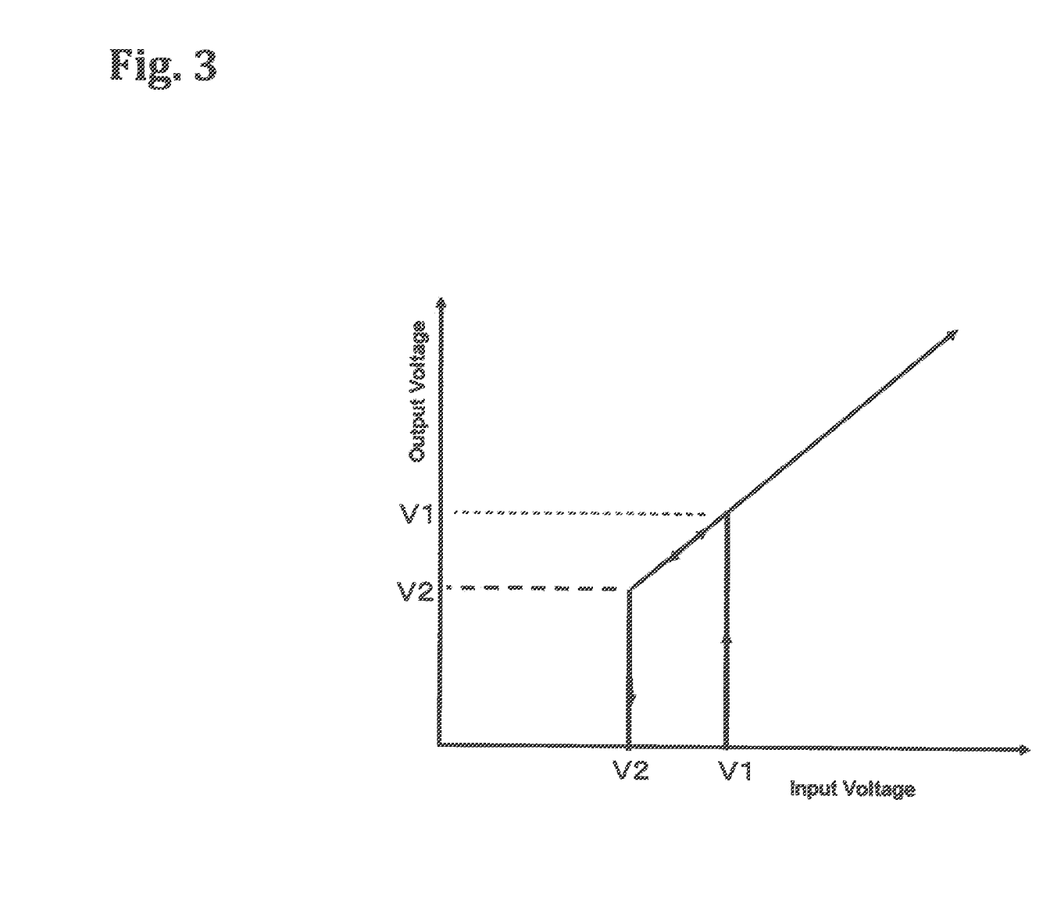
FIG. 3 is a characteristic chart of a switch circuit having hysteresis characteristics.

FIG. 3 is a characteristic chart of a switch circuit having hysteresis characteristics, showing a relationship between an input voltage of the switch circuit 129 and an output voltage of a point B to be connected to an input terminal 152 of the constant voltage power supply circuit. At the point of time when the input voltage reaches V1, the input voltage is transmitted to such an output end, whereby characteristics are obtained, in which energization is maintained at the input voltage V2 or higher by an action of the Schmidt trigger circuit 127 having the hysteresis characteristics.

The switching-type constant voltage power supply circuit 130 is a step-down power supply circuit, which compares, by a comparator 133, a voltage of an output of a triangular wave generation circuit 132 with a reference voltage RefV obtained by dividing a power supply output voltage between a resistor 136 and a resistor 137, and allows drive of an ON/OFF operation of a duty cycle necessary for the switching element 131. Moreover, a diode 134 supplies a current at the time when an operation of the switching element 131 is off, and an inductor 135 stores energy at the time when the operation of the switching element 131 is on, supplies a current to the output continuously during both ON and OFF periods of switching. Moreover, a capacitor 138 removes a ripple voltage caused by such a switching operation.

Figure 4:
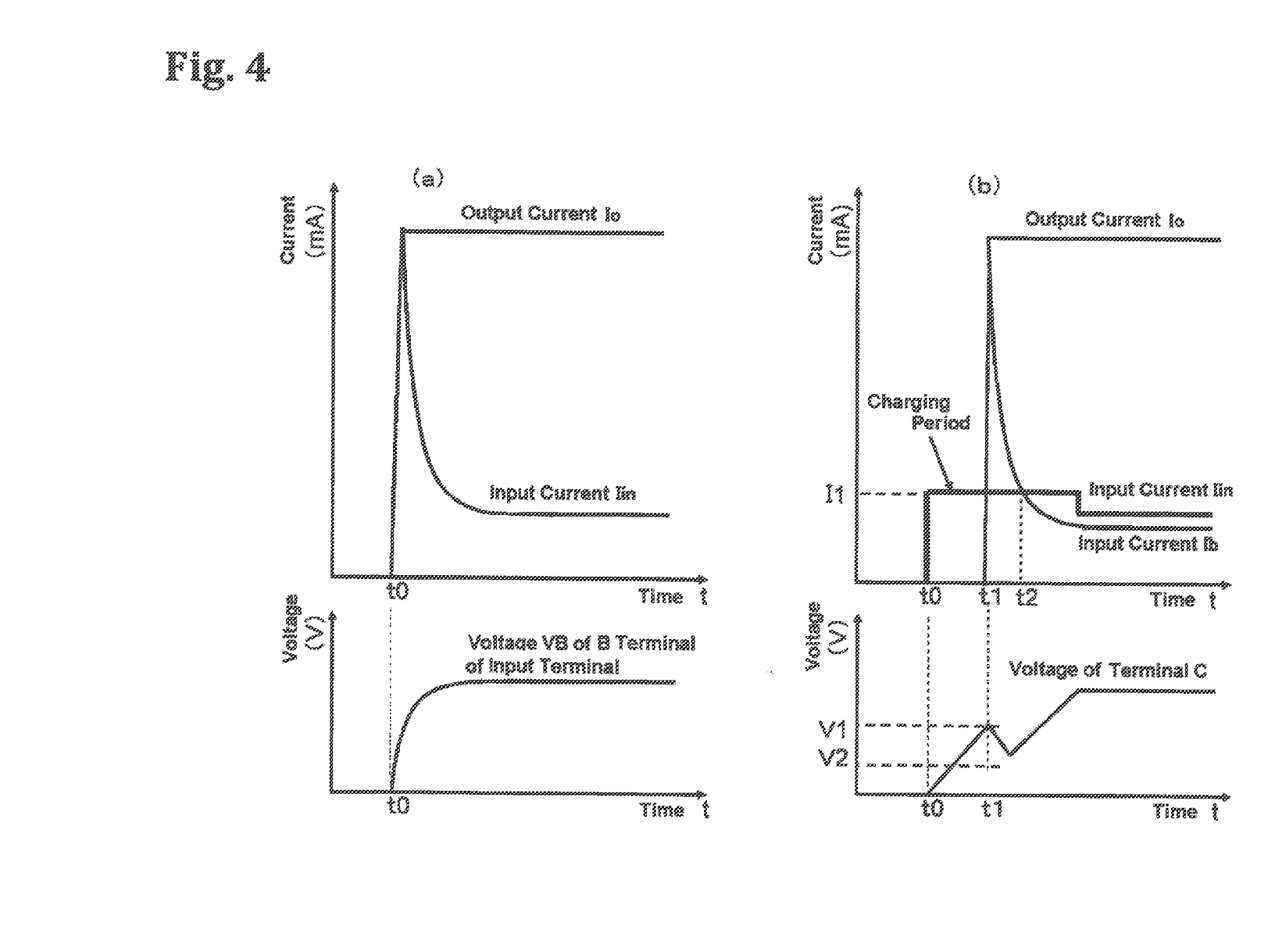
FIGS. 4(a) and 4(b) are current/voltage characteristic charts at a time when a step-like power supply input voltage is applied.

FIG. 4(*a*) is time transition graphs of an input current Iin and output current Io of the constant voltage power supply circuit 130 in the case where a current limiting value of the constant voltage power supply circuit 110 is increased to set the switch 125 in a continuously closed state, and the rating voltage is supplied in a stepping manner to the power supply device at a time t0. In general, in the case where a switching power supply drops the input voltage to output a low voltage, a ratio of input power and output power is approximate to 1 since the switching power supply has good power efficiency. Hence, the output current is increased in inverse proportion to the output voltage, and the input current is reduced by an amount of the increase of the input voltage as compared with the output current. However, at the time when an operation of a switching circuit is activated, a phenomenon is seen, where the input current and the output current require substantially the same magnitude.

Specifically, in the case where the switch circuit 129 is not provided, the constant voltage power supply circuit 110 for largely stepping down the voltage from a high voltage requires an input current with the same magnitude as that of the output current, leading to a power supply with large power. For example, if an output capacity of the power supply device 101 is 0.25 W that allows supply of an output in which a voltage is 5V and a current is 50 mA, then, when the voltage of the photovoltaic power generation is 1000V, an input current of 50 mA, which is the same as a value of the output current, becomes necessary in order to functionally drive the circuit. Specifically, 50 W becomes necessary as the input power, which also implies that such necessary input power is as large as 200 times such an output power capacity of 0.25 W.

Meanwhile, FIG. 4(b) is time transition graphs of the input current Iin and output current Io of the constant voltage power supply circuit 130 in the case where the current limiting value of the constant voltage power supply circuit is set at a current limiting value I1 that is a little larger than the input current value Iin necessary at a steady time, and the rating voltage is supplied in a stepping manner to the power supply device at the time t0. Moreover, reference symbol Ib denotes an input current value at the point B connected to the input end 152 of the constant voltage power supply circuit 130, and a time transition of the input current Ib is shown in FIG. 4(b). In a lower portion of FIG. 4(b), a transition of the power supply voltage at a point C to be connected to an output end 153 of the first constant voltage power supply circuit 110 at the same point of time is also shown.

During a period from the time t0 to a time t1, which is shown in the graph of FIG. 4(b), electricity is charged to the capacitor 119. At the time t1 when the input voltage reaches the voltage V1 at which the switch circuit 129 is turned to the closed state, a current necessary to drive the switching-type constant voltage power supply circuit 130 is refilled and supplied from the capacitor 119.

A capacitor capacity value necessary for the capacitor 119 is determined by a total charge quantity brought by a current, which is discharged from the capacitor 119 during a period from the time t1 to a time t2, the period being shown in the graph of FIG. 4(b), which current takes the output current value Io as a peak, and which current largely exceeds the limited input current value Iin. The capacitor capacity value is a value realizable by a capacity of 10 to 100 microfarads.

If the input voltage does not drop to the voltage V2 or lower even if the input voltage is lowered in the Schmidt trigger circuit, the switch circuit 129 maintains the closed state thereof, and shifts to a steady state of the input current Iin.

For example, if the output capacity of the power supply device 101 is 0.25 W obtained by the voltage of 5V and the current of 50 mA, then the input current required by the switching-type constant voltage power supply circuit 130 is approximately 6 mA on the assumption that the input voltage of the constant voltage power supply circuit 130 is 50V, and that the efficiency thereof is 80%. Accordingly, such a current limit by the constant voltage power supply circuit 110 can be set at 7 mA. When the voltage of the photovoltaic power generation is 1000V, the input power of the direct-current stabilized power supply device 101 becomes 7 W.

In accordance with the configuration of this embodiment, the input current of the direct-current stabilized power supply device 101 is set at a small value limited by the constant voltage power supply circuit 110. In such a way, even at a starting time of the power generation, when a power generation voltage generated by the solar cell 141 varies heavily, the necessary current can be surely supplied to the constant voltage power supply 130. Moreover, the switching power supply is operated, and accordingly, the efficiency of the voltage conversion in the whole of the direct-current stabilized power supply device 101 is good, and the necessary power can be stably supplied to the measurement equipment at the time when the solar cell is operating.

Moreover, it is required that the power supply device be safe, for example, even at the time of a failure, when the capacitor 119 short-circuits, and in the constant voltage power supply circuit, the input current is limited to the minimum necessary. Accordingly, circuit elements and devices, such as a heat radiation plate, which are necessary in the power supply with large power, can be eliminated.

Second Embodiment

Figure 5:
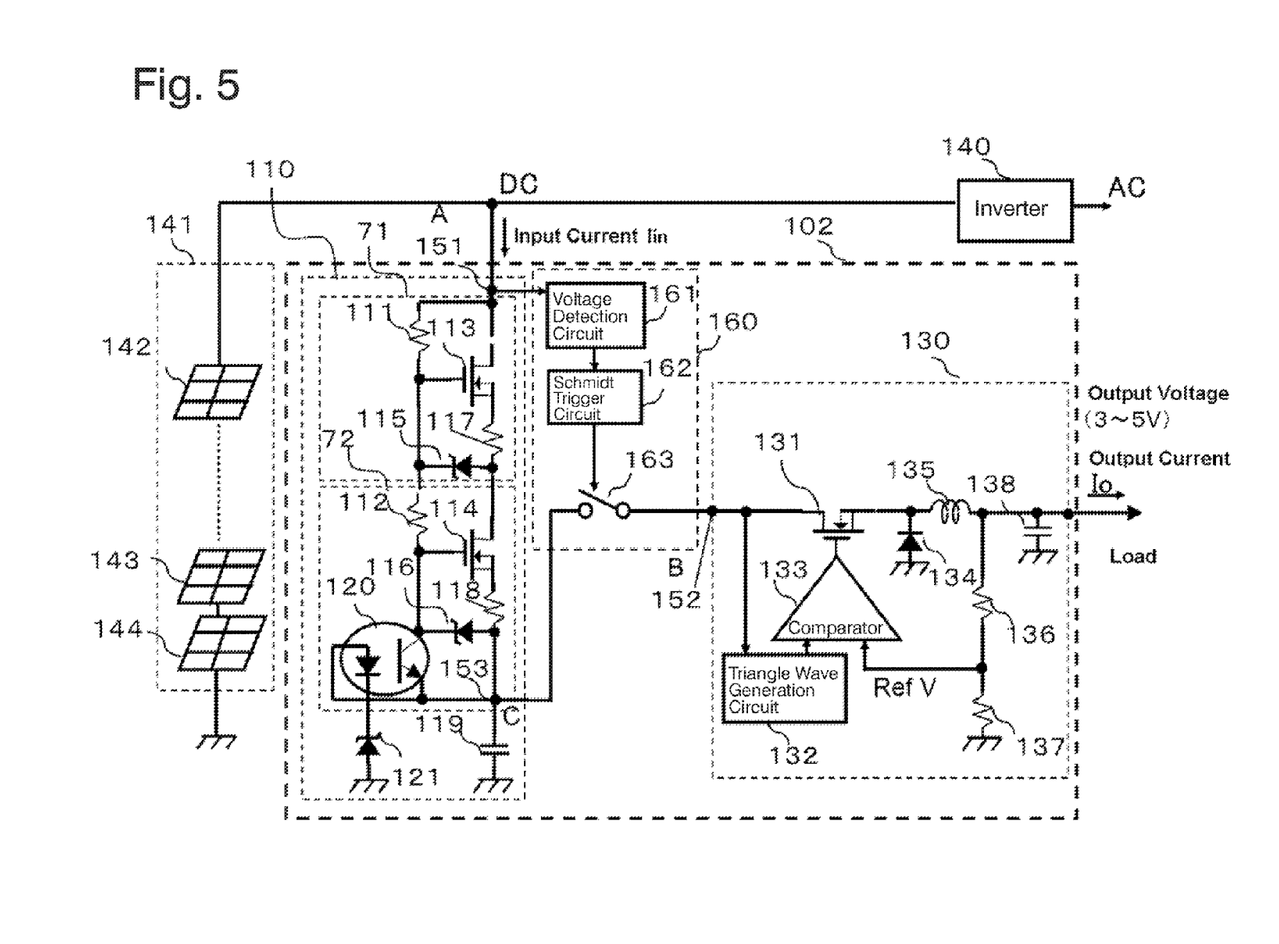
FIG. 5 is a configuration diagram of a second embodiment of a direct-current stabilized power supply device of the present invention.

FIG. 5 is a configuration diagram of a second embodiment of the direct-current stabilized power supply device of the present invention. In FIG. 5, the same reference numerals are used for the same constituents as those in FIG. 1 and FIG. 8, and a description thereof is omitted.

Different portions of the second embodiment from the first embodiment are that a switch circuit 160 uses an input voltage of a direct-current stabilized power supply device 102, which is the output voltage of the solar cell 141, as a detection input voltage of a voltage detection circuit 161, and is allowed to have a function to turn a switch element 163 to a closed state by an action of a Schmidt trigger circuit 162 when the detection voltage is a voltage value V3 or higher, and to turn the switch element 163 to an opened state by an action of the Schmidt trigger circuit 162 when the detection voltage becomes a voltage value V4 or lower. Others are similar to those in the description of the first embodiment, which is made with reference to FIG. 1, and accordingly, a description thereof is omitted.

With regard to the output voltage of the solar cell 141, the power generation is stopped at night (output voltage is 0V), and when the day breaks, the voltage rises. A rising curve of the voltage is influenced by a weather state, sometimes fluctuates during a period until the inverter 140 starts to operate, and is unstable. The operation of the measurement equipment in the photovoltaic power generation is not necessary during the period while the solar cell 141 is not generating power, and meanwhile, is necessary in a state where the inverter is operating. Hence, at the time when the voltage of the solar cell 141 rises, it is necessary to supply a power from the power supply device 102 at a voltage before the operation of the inverter is started.

Figure 6:
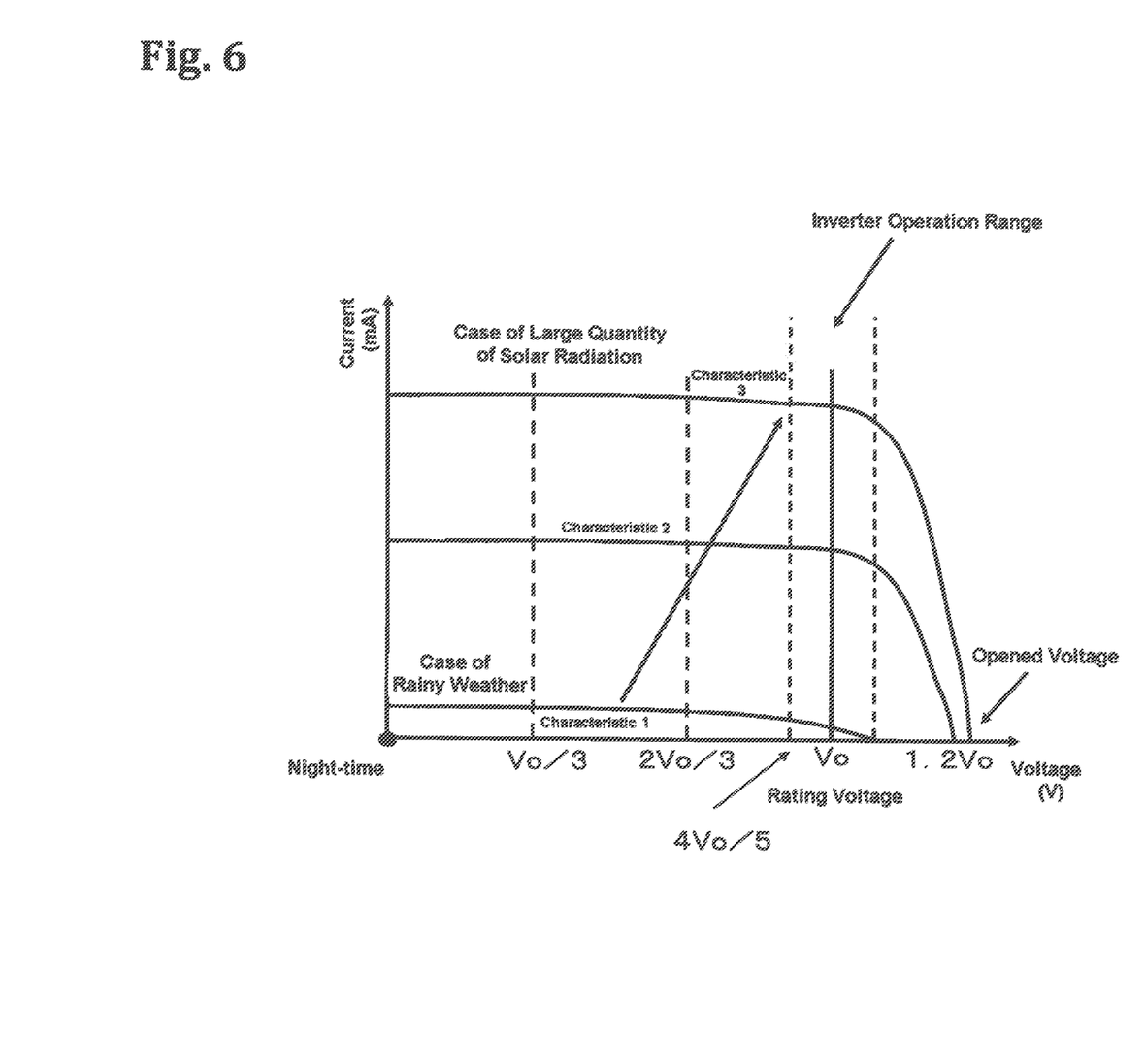
FIG. 6 is a power generation characteristic chart of a solar cell.

In general, the power generation voltage of the solar cell is determined by the number of serially connected photovoltaic power generation modules and the quantity of solar radiation to the photovoltaic power generation modules, and has characteristics shown in FIG. 6. At night, a power generation current and the power generation voltage are zero, and as the quantity of solar radiation is being increased, a characteristic curve moves right upward like Characteristics 1, Characteristics 2 and Characteristics 3. The inverter acts at, as an operating point, a voltage at which the maximum power is taken out from the solar cell, and this voltage is referred to as a rating voltage Vo. The maximum voltage in a state where the solar cell is opened while the inverter is left unoperated becomes approximately 1.2 to 1.3 times the rating voltage.

In the direct-current stabilized power supply device 102 supplied with the power from the solar cell 141 having the characteristics as mentioned above, if the voltage value V3 is set at a voltage that is $\frac{2}{3}$ of the rating voltage Vo, then no trouble occurs when the voltage concerned is used as the power supply for the measurement equipment of the photovoltaic power generation since an inverter operation range is usually managed within ±20%. Moreover, with regard to a voltage fluctuation at the time of dawn, the voltage that has rises once does not drop to ½ thereof in the actual measurement. Accordingly, if the voltage value V4 at which the switch element 163 is turned to the opened state is set at a voltage that is ⅓ of the rating voltage Vo, then, once the power supply device 102 starts to operate at the time of dawn, the direct-current stabilized power supply device 102 is not stopped midway until the power generation is ended in the evening.

Figure 7:
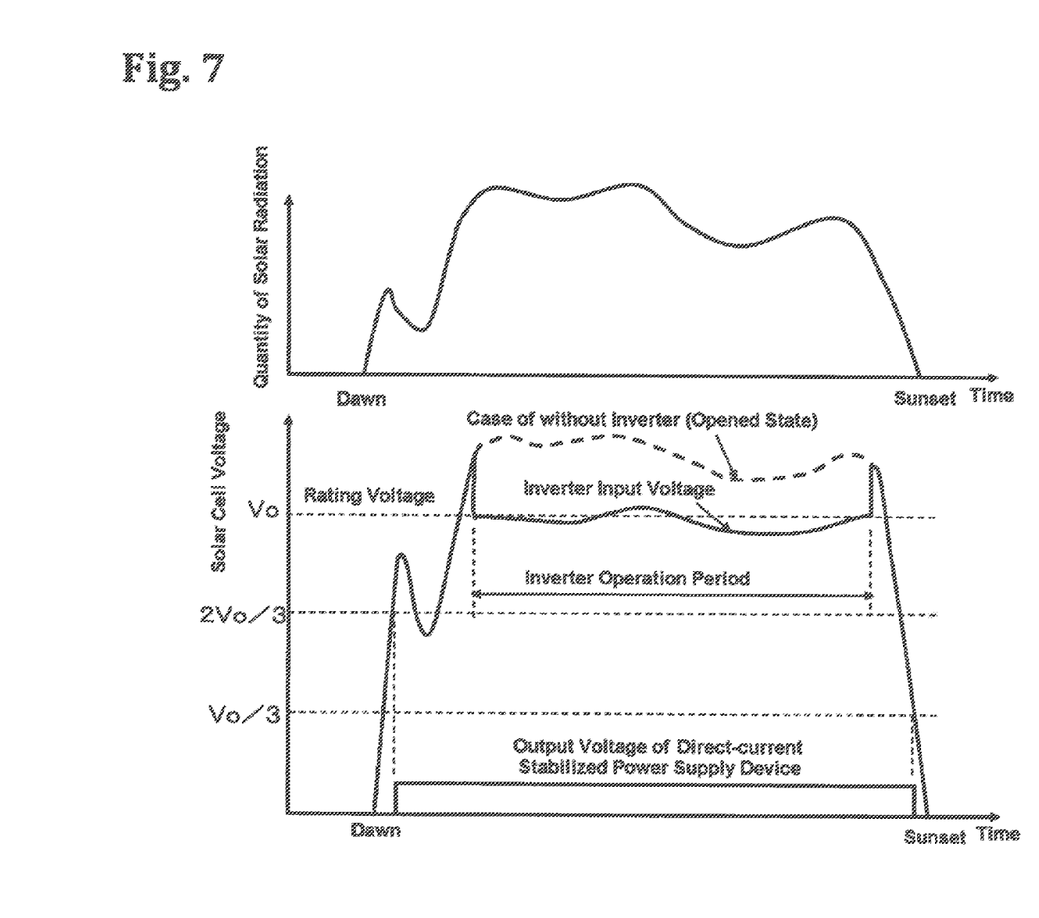
FIG. 7 is a chart showing a change of a quantity of the solar radiation and a change of an inverter input voltage.

FIG. 7 shows an example of temporal changes of the voltage to be supplied from the solar cell to the power supply device and the current to be supplied to the inverter in the case where the photovoltaic power generation is started from the time of dawn, and the quantity of solar radiation is largely changed to the time of sunset.

In accordance with the configuration of this embodiment, the input current of the direct-current stabilized power supply device 102 can be set at a small current value limited by the constant voltage power supply circuit 110. In such a way, even at the starting time of the power generation, when the power generation voltage generated by the solar cell 141 varies heavily, the necessary current can be surely supplied to the constant voltage power supply 130 during the period while the inverter 140 is operating and periods before and after the period concerned by the action of the switch circuit 160. Moreover, the switching power supply is operated, and accordingly, the efficiency of the voltage conversion in the whole of the power supply device 101 is good, and the necessary power can be stably supplied to the measurement equipment at the time when the solar cell is operating.

A high voltage from the solar cell 141 is applied to the first constant voltage power supply circuit 110. Accordingly, high performance is required for withstand voltage characteristics between the drain and source of each of the N-MOS type FETs 113 and 114. However, it is difficult to satisfy withstand voltage characteristics against the high voltage by the N-MOS type FETs with a large current capacity, generally leading to a cost increase. In the case where the current capacity is small in the serial-type step-down constant voltage circuit, inexpensive N-MOS type FETs can be used.

Moreover, in the case where the first current limiter circuit 71 and the second current limiter circuit 72 are connected in column to each other, with regard to the voltage to be applied between the drain and source of each of the N-MOS type FETs, the high input voltage to be applied to the power supply device is divided by the bias resistors 111 and 112, and the withstand voltage performance thereof is reduced to ½ in the case where the resistance values of the bias resistor 111 and the bias resistor 112 are equal to each other.

Note that, in the above-described embodiment, the constant voltage power supply circuit 110 in charge of the constant current control is configured so that the first current limiter circuit 71 by the N-MOS type FET 113 and the second current limiter circuit 72 by the N-MOS type FET 114 can be connected in series to each other; however, in the case where the power generation voltage of the solar cell 141 is not the high voltage, and there is a sufficient margin in the withstand voltage characteristic between the drain and source of each of the N-MOS type FETs, the current limiter circuits may be one.

Moreover, the current value Im1 to be limited by the first constant current limiter circuit 71 may be set smaller in advance than the current value Im2 to be limited by the second constant current limiter circuit 72. In such a way, even in the case where the load on the output side is largely changed, a withstand voltage balance between the drain and source of each of the two N-MOS type FETs can be maintained. If the current value Im2 to be limited by the second constant current limiter circuit 72 is smaller than the current value Im1 to be limited by the first constant current limiter circuit 71, then conduction between the drain and source of the first constant current limiter circuit 71 turns to an ON state under conditions where the current value is limited by Im2, and there occurs an apprehension that the voltage to be applied to the second constant current limiter circuit 72 may be increased to exceed an allowance of the withstand voltage performance.

INDUSTRIAL APPLICABILITY

The direct-current stabilized power supply device of the present invention can stably supply the necessary power to the measurement equipment of the solar cell power supply from the power generation voltage of the solar cell, which varies heavily. Accordingly, the direct-current stabilized power supply device of the present invention is extremely useful as a direct-current stabilized power supply device that drops the voltage from the power supply of the solar cell and the like, in which the output power is unstable, and supplies the necessary stable voltage.

EXPLANATION OF REFERENCE NUMBER

10: rectifier circuit
11: switching power supply circuit
12: three-terminal regulator
13: capacitor
14: capacitor
15: comparator
43: solar cell power supply
45: measurement equipment
71: constant current limiter circuit
72: constant current limiter circuit
101: direct-current stabilized power supply device
102: direct-current stabilized power supply device
110: constant voltage power supply circuit
111: bias resistor
112: bias resistor
113: N-MOS type FET
114: N-MOS type FET
115: Zener diode
116: Zener diode
117: current limiter resistor
118: current limiter resistor
119: capacitor
120: phototransistor
121: Zener diode
125: switch
126: voltage detection circuit
127: Schmidt trigger circuit
129: switch circuit
130: constant voltage power supply circuit
131: switching element
132: triangular wave generation circuit
133: comparator
134: diode
135: inductor
136: resistor
137: resistor
138: capacitor
140: inverter
141: solar cell
142: photovoltaic power generation module 143: photovoltaic power generation module
144: photovoltaic power generation module
152: output end
153: output end
160: switch circuit
161: voltage detection circuit
162: Schmidt trigger circuit
163: switch element

The invention claimed is:

1. A direct-current stabilized power supply device that steps down a direct-current input voltage obtained from a solar cell and outputs the stepped-down voltage to a load, the device comprising:
   a first constant voltage power supply circuit that is of a serial type and steps down the input voltage, the first constant voltage power supply circuit being connected to the solar cell and including a first current limiter circuit and a second current limiter circuit connected in series between the input voltage and a first node having an output voltage of the first constant voltage power supply circuit;
   a switch circuit connected to the first node;
      wherein the switch circuit includes a voltage detection circuit configured to detect the input voltage or the output voltage of the first constant voltage power supply circuit; and
      a Schmidt trigger circuit connecting the first node to a second node, the Schmidt trigger circuit being coupled to the voltage detection circuit and configured to have a closed state coupling the first node to the second node when the voltage detected by the voltage detection circuit is equal to or higher than a first determination voltage, and to have an opened state isolating the first node from the second node when the detected voltage is equal to or lower than a second determination voltage lower than the first determination voltage; and
   a switching-type second constant voltage direct current power supply circuit connected to the second node such that when the switch circuit is in a closed state, power is supplied to the switching-type second constant voltage direct current power supply circuit from the first constant voltage power supply circuit, and power is supplied to the load from the second constant voltage direct current power supply circuit, and when the switch circuit is in an open state, power is not supplied to the switching-type second constant voltage direct current power supply circuit from the first constant voltage power supply circuit; and no power is supplied to the load from the second constant voltage direct current power supply circuit, the second constant voltage direct current power supply including a switch element selectively coupling the second node to an output node when power is supplied to the switching-type second constant voltage direct current power supply circuit from the first constant voltage power supply circuit, and a comparator, responsive to a voltage representative of an output voltage on the output node, for operating the switch element with a duty cycle appropriate for maintaining the output voltage on the output node at a selected level.

2. The direct-current stabilized power supply device according to claim 1, wherein the first determination voltage is equal to or lower than $4/5$ of a rating voltage at which the output voltage of the first constant voltage power supply circuit is stabilized, and the second determination voltage is equal to or higher than 6/5 of a minimum input voltage at which an output voltage of the second constant voltage direct current power supply circuit is stabilized.

3. A direct-current stabilized power supply device that steps down direct-current input power obtained from a solar cell and outputs the stepped-down power to a load, the device comprising:
   a first constant voltage power supply circuit that is of a serial type and steps down a voltage, the first constant voltage power supply circuit being connected to the solar cell and including a first current limiter circuit and a second current limiter circuit connected in series between the input voltage and a first node having an output voltage of the first constant voltage power supply circuit;
   a switch circuit connected to the first node;
      wherein the switch circuit includes a voltage detection circuit configured to detect the input voltage or the output voltage of the first constant voltage power supply circuit; and
      a Schmidt trigger circuit connecting the first node to a second node, the Schmidt trigger circuit being coupled to the voltage detection circuit and configured to have a closed state coupling the first node to the second node when the voltage detected by the voltage detection circuit is equal to or higher than a first determination voltage, and to have an opened state isolating the first node from the second node when the detected voltage is equal to or lower than a second determination voltage lower than the first determination voltage; and
   a switching-type second constant voltage direct current power supply circuit connected to the second node such that when the switch circuit is in a closed state, power is supplied to the switching-type second constant voltage direct current power supply circuit from the first constant voltage power supply circuit, and power is supplied to the load from the second constant voltage direct current power supply circuit, and when the switch circuit is in an open state, power is not supplied to the switching-type second constant voltage direct current power supply circuit from the first constant voltage power supply circuit; and no power is supplied to the load from the second constant voltage direct current power supply circuit, the second constant voltage direct current power supply including a switch element selectively coupling the second node to an output node when power is supplied to the switching-type second constant voltage direct current power supply circuit from the first constant voltage power supply circuit, and a comparator configured to operate the switch element with a duty cycle appropriate for maintaining the output voltage on the output node at a selected level by comparing an output voltage of a triangular wave generation circuit and a reference voltage derived from the output voltage on the output node.

4. The direct-current stabilized power supply device according to claim 3, wherein the first determination voltage ranges from $2/3$ to $4/5$ of a rating voltage as a voltage value at which the solar cell stably generates power, and the second determination voltage is equal to or lower than $1/3$ of the rating voltage.

5. The direct-current stabilized power supply device according to any one of claims 1 to 4, wherein a maximum supply current value limited by the first constant voltage power supply circuit is 1 to 1.5 times a maximum supply current value limited by the second constant voltage direct current power supply circuit.

6. The direct-current stabilized power supply device according to any one of claims 1 to 4, wherein at least one of the first current limiter circuit and the second current limiter circuit includes a Zener diode and an N-MOS type FET.

7. The direct-current stabilized power supply device according to any one of claims 1 to 4, wherein the first current limiter circuit and the second current limiter circuit are configured to perform feedback control for the output voltage of the first constant voltage power supply circuit, in which a high voltage to be applied between an input terminal and output terminal of the first constant voltage power supply circuit is equally divided.

* * * * *